(12) United States Patent
Nanba et al.

(10) Patent No.: US 6,944,251 B1
(45) Date of Patent: Sep. 13, 2005

(54) DIGITAL PHASE LOCK LOOP CIRCUIT

(75) Inventors: Akira Nanba, Hyogo (JP); Kenichi Ogura, Kawasaki (JP); Manabu Ogino, Hyogo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/857,185

(22) PCT Filed: Jan. 8, 1999

(86) PCT No.: PCT/JP99/00055

§ 371 (c)(1),
(2), (4) Date: Jun. 20, 2001

(87) PCT Pub. No.: WO00/41176

PCT Pub. Date: Jul. 13, 2000

(51) Int. Cl.[7] .............................................. H03D 3/24

(52) U.S. Cl. ..................................... 375/376; 375/355

(58) Field of Search ............................... 375/294, 327, 375/344, 355, 373, 375, 376; 327/141, 146, 327/147, 155, 156; 369/59.19

(56) References Cited

U.S. PATENT DOCUMENTS

| 5,442,315 | A |   | 8/1995  | Hutchins ..................... 327/159 |
|-----------|---|---|---------|---------------------------------------|
| 5,572,157 | A | * | 11/1996 | Takashi et al. .............. 327/156  |
| 5,754,138 | A | * | 5/1998  | Turcotte et al. ............. 342/373  |
| 5,903,484 | A |   | 5/1999  | Tsujihashi ................... 708/620 |
| 6,118,745 | A | * | 9/2000  | Hutchins et al. ......... 369/59.19    |
| 6,246,733 | B1| * | 6/2001  | Hutchins ..................... 375/355 |

FOREIGN PATENT DOCUMENTS

| JP | A-6-325506 | 11/1994 |
| JP | A-10-40079 | 2/1998  |

* cited by examiner

Primary Examiner—Chieh M. Fan
(74) Attorney, Agent, or Firm—Arent Fox PLLC

(57) ABSTRACT

The digital phase locked loop circuit according to the invention includes a GAC circuit (4) for calculating the average frequency of the phase locked sampling clock signals in selected channels and for feeding back the calculated average to the phase locked loop. The GAC circuit (4) includes comparators ($11_1$~$11_8$) for comparing the frequency of the sampling clock signals in each channel with an allowable frequency range and for outputting a frequency error signal with respect to any channel in which the frequency of the sampling clock signals is outside the allowable frequency range.

14 Claims, 5 Drawing Sheets

DIGITAL PHASE LOCK LOOP CIRCUIT

This application is a 371 of PCT/JP99/00055 filed Jan. 8, 1999.

TECHNICAL FIELD

The present invention relates to a digital phase locked loop circuit which is particularly suitable for generating sampling clock signals for sampling reproduced information obtained from the read heads of a magnetic tape apparatus.

BACKGROUND ART

When reproducing information recorded on a recording medium such as an optical disk, optical-magnetic disk, magnetic disk, or magnetic tape, it is necessary to generate sampling clock signals synchronized with the pulse train which is the reproduced information obtained from the read heads.

Phase locked loop circuits are widely used to generate this type of sampling clock signals. Phase locked loop circuits may be analog circuits or digital circuits. The digital circuits include partially digital circuits which partly include analog components such as oscillator portions, and completely digital circuits which do not include any analog components.

Of these phase locked loop circuits, the completely digital phase locked loop circuits have the advantages that they can be integrated to a very high degree and do not require various types of adjustments. An example of such a phase locked loop circuit is disclosed in U.S. Pat. No. 5,442,315.

However, various problems occur with this type of conventional digital phase locked loop circuit, especially when employed in the playback circuit of a magnetic tape apparatus.

In a magnetic tape apparatus, for example, a phenomenon called "drop out" occurs wherein reproduced information is not attained. This is caused by defects in the magnetic tape medium itself, or the adhesion of dust or dirt to the magnetic heads. When drop out occurs, the phase locked loop circuit slips from a state where the input frequency and phase to be locked are normal and drops out of lock. A conventional phase locked loop circuit does not have a function of detecting this dropping from lock for each channel. Moreover, after the loop drops out of lock because of drop out, even if normal reproduced information is input, the mobile frequency cannot be easily synchronized because the mobile frequency slips with respect to input and the time to recover the locked state is long.

Also, in a magnetic tape apparatus, the magnetic tape travels while in contact with the magnetic heads and therefore the traveling speed of the magnetic tape varies because of variations in the frictional resistance between the magnetic tape and magnetic head due to the capacity of the traveling motor, variations in the exciting current of the traveling motor, variations in tape tension, or the adhesion of dust and dirt. Such variations in the traveling speed are especially large in comparison to the variations in rotation speed of different types of disks.

Variations in traveling speed occur in the same way during writing and reading, but may also occur in mutually opposite directions. In this case, the result is that the traveling speed during writing and the traveling speed during reading vary to extremes and the phase locked loop circuit may not be able to track the variations.

Consequently, while performing reading at the same time as writing, it is necessary to monitor variations in traveling speed continually and when the traveling speed varies in excess of a prescribed range, to execute a process to rewind the magnetic tape once and perform writing once more. However, a conventional digital phase locked loop circuit does not have a function for monitoring variations in the traveling speed of the recording medium.

DISCLOSURE OF THE INVENTION

It is, therefore, an object of the present invention to provide a digital phase locked loop circuit that can detect lock slippage promptly for each channel.

Another object of the present invention is to provide a digital phase locked loop circuit that can monitor the playback speed of reproduced information continually.

According to a first aspect of the present invention, there is provided a digital phase locked loop circuit for generating sampling clock signals used with respect to a plurality of channels for sampling reproduced information simultaneously from a plurality of tracks of a recording medium, comprising an average frequency computing circuit for calculating an average frequency of the phase locked sampling clock signals in selected channels and feeding back the calculated average to the phase locked loop, wherein the average frequency computing circuit outputs a frequency error signal with respect to any channel in which the frequency of the sampling clock signals is outside an allowable frequency range.

Preferably, the average frequency computing circuit comprises a comparator for comparing the frequency of the sampling clock signals in each channel with the allowable frequency range and for outputting a frequency error signal for any channel in which the frequency of the sampling clock signals is outside an allowable frequency range.

Preferably, the average frequency computing circuit calculates the average frequency of the sampling clock signals in the selected channels which do not include those channels in which the frequency of the sampling clock signals is outside the allowable frequency range.

Preferably, the digital phase locked loop circuit further comprises a register for adjustably setting a value representative of an allowable deviation. In this case, the allowable frequency range is determined on the basis of the average frequency calculated by the average frequency computing circuit and the set value from the register.

Preferably, the digital phase locked loop circuit further comprises a gate circuit for masking the frequency error signal in an operational mode other than a tracking mode.

Preferably, the average frequency computing circuit divides the plurality of channels into a plurality of groups each of which includes at least two channels. In this case, the frequencies of the sampling clock signals for the plurality of channels are summed repetitively and cumulatively group by group for calculating the average frenquency.

Preferably, the average frequency computing circuit is reset in a calibration mode for performing calibration of the frequencies to be phase locked.

Preferably, the average frequency computing circuit includes a holding circuit for holding the average frequency which has been obtained immediately previously when all of the channels are in an operational mode other than a tracking mode.

Preferably, when the average frequency computing circuit outputs a frequency error signal for any channel, resynchronization of the sampling clock signals is performed only for the erring channel.

Preferably, the resynchronization of the sampling clock signals is performed at high speed in a lead-in mode by using the average frequency calculated by the average frequency computing circuit.

According to a second aspect of the present invention, there is provided a digital phase locked loop circuit for generating sampling clock signals used with respect to a plurality of channels for sampling reproduced information simultaneously from a plurality of tracks of a recording medium, comprising an average frequency computing circuit for calculating an average frequency of the phase locked sampling clock signals in selected channels and feeding back the calculated average to the phase locked loop, wherein the average frequency computing circuit comprises a speed variation detecting circuit for determining a rate of variation of the average frequency in a predetermined time.

Preferably, the rate variation detecting circuit includes a comparator for comparing a variation width, in the predetermined time, of the average frequency determined by the average frequency computing circuit with an allowable variation range and for outputting a speed error signal if the variation width is outside the allowable variation range.

Preferably, the speed variation detecting circuit is capable of adjustably setting the predetermined time.

The various features and advantages of the present invention will be apparent on the basis of the embodiments given below with reference the attached drawings.

BEST MODE FOR CARRYING OUT THE INVENTION

An embodiment of the present invention is explained below on the basis of FIGS. 1 through 5.

Figure 1:
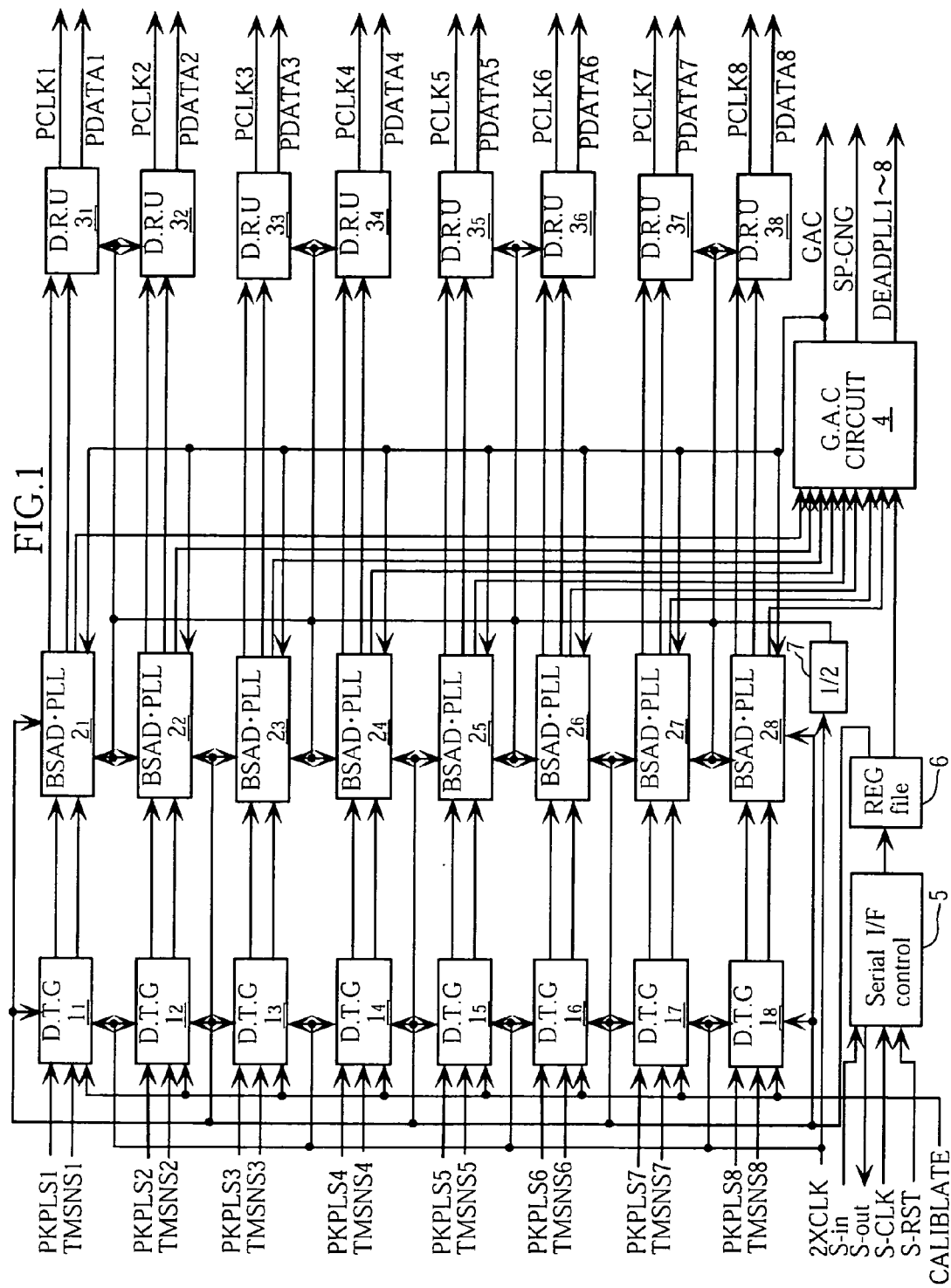
FIG. 1 is a circuit block diagram of a digital phase locked loop circuit according to an embodiment of the present invention.

As shown in FIG. 1, the digital phase locked loop circuit according to the embodiment of the present invention includes eight DTG (digital time generation) circuits $1_1$~$1_8$, eight BSADPLL (bit stream asynchronous digital phase locked loop) circuits $2_1$ through $2_8$, eight DRU (data recovery unit) circuits $3_1$~$3_8$, one GAC (global average clock) circuit 4, one interface circuit 5, one register file 6, and one frequency halving circuit 7.

This digital phase locked loop circuit is a phase locked loop circuit that is completely digital and is used to generate sampling clock signals for sampling reproduced information obtained from the read heads of a magnetic tape apparatus. The magnetic tape has 128 tracks, and the magnetic heads are designed to read 16 tracks simultaneously. Specifically, 16 groups of magnetic heads are provided, and each group comprises a total of four magnetic heads which include a write head and a read head for reading and writing one track in the forward direction as well as a write head and a read head for reading and writing one track in the reverse direction.

The circuit shown in FIG. 1 is incorporated in one IC (integrated circuit) chip and is designed to process 16 channels of reproduced information with two IC chips. 16 channels of reproduced information may be processed with only one IC chip.

The DTG circuits $1_1$~$1_8$ output relative position signals and PKPLS detection signals to the BSADPLL circuits $2_1$~$2_8$ with the input of these signals PKPLS1~PKPLS8. The signals PKPLS1~PKPLS8 are signals that become high level when the playback pulse obtained from the read head is "1". Each of the relative position signals is a signal including six bits of binary data indicating the respective position of the signals PKPLS1 through PKPLS8 relative to the standard clock signal 1XCLOCK.

With the input of the relative position signals and PKPLS detection signals from the DTG circuits $1_1$~$1_8$ and the signal GAC corresponding to the average frequency value from the GAC circuit 4, the BSADPLL circuits $2_1$~$2_8$ output an input phase estimation signal corresponding to the phase of the signals PKPLS1~PKPLS8 and a DPLL phase integrator output phase signal to the DRU circuits $3_1$~$3_8$ while outputting signals PLLfreq1~PLLfreq8 to the GAC circuit 4. The signals PLLfreq1~PLLfreq8 correspond to the frequencies of the signals PKPLS1~PKPLS8 and are 15 bits of data including a sign bit. The signals PLLfreq1~PLLfreq8 are established so that their values become 0 when the frequency in the phase locked state corresponding to the frequencies of the signals PKPLS1~PKPLS8 are equal to the standard clock signal 1XCLOCK.

With the input of the input phase estimation signals and the PLL phase integrator output phase signals from the BSADPLL circuits $2_1$~$2_8$, the DRU circuits $3_1$~$3_8$ output the signals PDATA 1~PDATA 8 corresponding to the reproduced information and the sampling clock signals PCLK1~PCLK8 thereof.

With the input of the signals PLLfreq1~PLLfreq 8 from the BSADPLL circuits $2_1$~$2_8$, the GAC circuit 4 detects the average frequency of the signals PKPLS1~PKPLS8 for eight channels and outputs the signal GAC. The GAC circuit 4 also outputs the speed error signals SPCHNG when the variation band of the signal GAC exceeds the allowable range within the prescribed time period.

The interface circuit 5 controls communication between the digital phase locked loop circuit and the external circuits.

The register file 6 includes a plurality of registers for holding various types of set values supplied from a CPU (central processing unit), not shown.

The frequency halving circuit 7 divides the clock signal 2XCLOCK in half and generates the standard clock signal 1XCLOCK.

Figure 2:
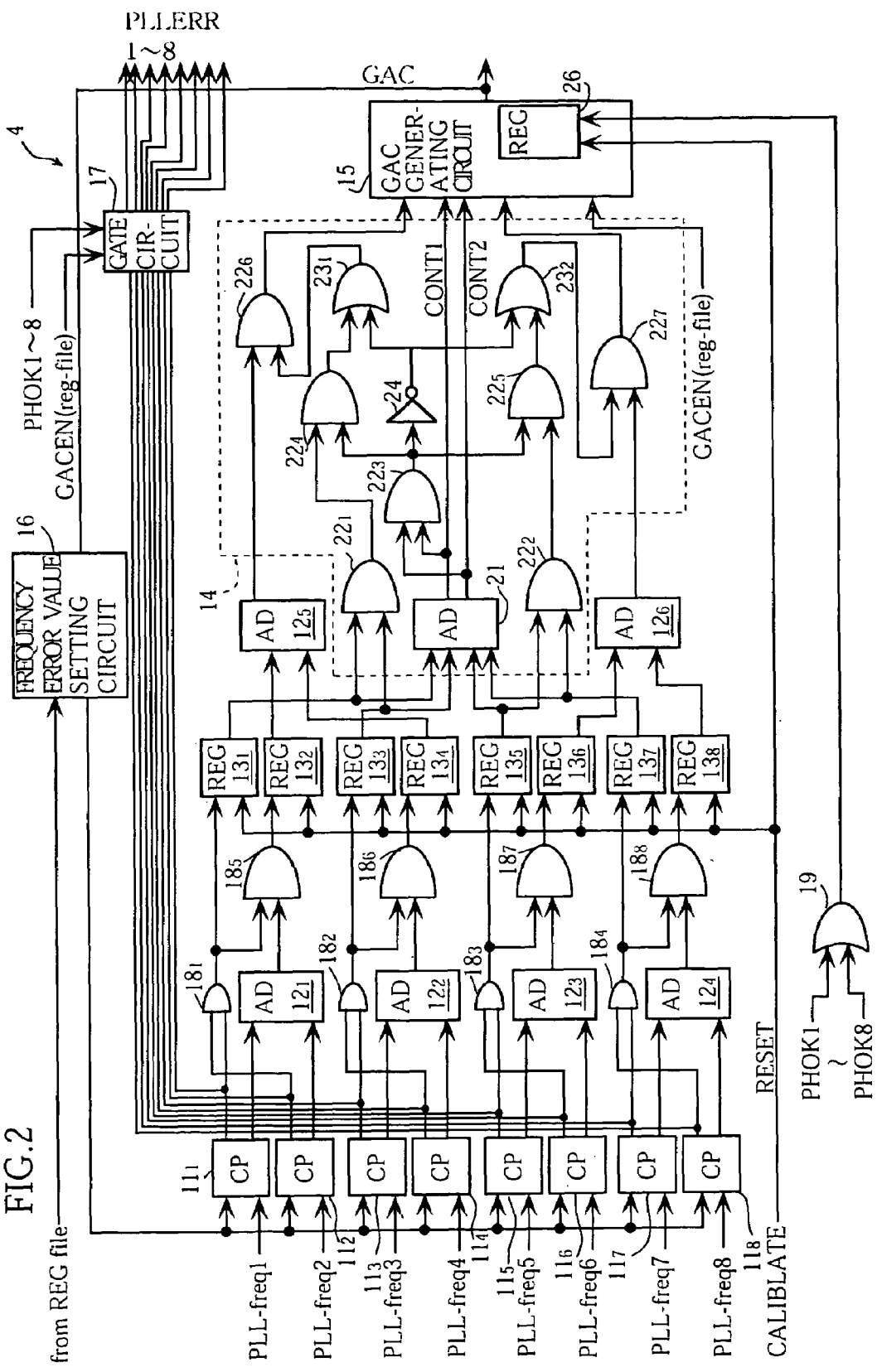
FIG. 2 is a circuit block diagram of a GAC circuit incorporated in the digital phase locked loop circuit shown in FIG. 1.

As shown in FIG. 2, the GAC circuit 4 includes eight comparators $11_1$~$11_8$ six adders $12_1$~$12_6$, eight registers $13_1$~$13_8$, a circuit 14 for determining the number of input channels (hereafter referred to as "input-channels-number determining circuit"), a GAC generating circuit 15, a frequency error value setting circuit 16, a gate circuit 17, eight AND circuits $18_1$~$18_8$, and an OR circuit 19. Note that the tape speed variation detecting circuit is not shown in FIG. 2.

The input-channels-number determining circuit 14 includes an adder 21, seven AND circuits $22_1$~$22_7$, two OR circuits $23_1$ and $23_2$, and an inverter 24.

The GAC generating circuit 15 includes a register 26.

The comparators $11_1 \sim 11_8$ compare, for each channel, the signals PLLfreq1~PLLfreq8 from the BSADPLL circuits $2_1 \sim 2_8$ with the maximum allowable frequency value and the minimum allowable frequency value from the frequency error value setting circuit 16. If the signals PLLfreq1~PLLfreq8 are not within the allowable frequency range, the comparators output a high level signal to the gate circuit 17 and the AND circuits $18_1 \sim 18_4$. The comparators $11_1$, $11_2$ output the signals PLLfreq1 and PLLfreq2 to the adder $12_1$. The comparators $11_3$, $11_4$ output the signals PLLfreq3 and PLLfreq4 to the adder $12_2$. The comparators $11_5$, $11_6$ output the signals PLLfreq5 and PLLfreq6 to the adder $12_3$. The comparators $11_7$, $11_8$ output the signals PLLfreq7 and PLLfreq8 to the adder $12_4$.

The adder $12_1$ adds the signals PLLfreq1 and PLLfreq2 from the comparators $11_1$, $11_2$ and outputs the sum to the AND circuit $18_5$. The adder $12_2$ adds the signals PLLfreq3 and PLLfreq4 from the comparators $11_3$, $11_4$ and outputs the sum to the AND circuit $18_6$. The adder $12_3$ adds the signals PLLfreq5 and PLLfreq6 from the comparators $11_5$, $11_6$ and outputs the sum results to the AND circuit $18_7$. The adder $12_4$ adds the signals PLLfreq7 and PLLfreq8 from the comparators $11_7$, $11_8$ and outputs the sum to the AND circuit $18_8$.

The adder $12_5$ adds data contained the register $13_2$ and data contained in the register $13_4$ and outputs the sum to the AND circuit $22_6$ of the input-channels-number determining circuit 14. The adder $12_6$ adds data contained the register $13_6$ and data contained in the register $13_8$, and outputs the sum to the AND circuit $22_7$ of the input-channels-number determining circuit 14.

Each of the registers $13_1$, $13_3$, $13_5$, and $13_7$ is a one-bit register for storing the output of the AND circuits $18_1 \sim 18_4$, respectively.

Each of the registers $13_2$, $13_4$, $13_6$, and $13_8$ is a 16-bit register for storing the output of the AND circuits $18_5 \sim 18_8$, respectively.

The input-channels-number determining circuit 14 supplies the GAC generating circuit 15 with information for computing the average frequency signal GAC.

The GAC generating circuit 15 computes the signal GAC on the basis of the information from the input-channels-number determining circuit 14 and outputs the result to the frequency error value setting circuit 16 and the BSADPLL circuits $2_1 \sim 2_8$. The GAC generating circuit 15 becomes effective when the signal GACEN from the register file 6 is at high level, and outputs all zeros when the signal GACEN is low level.

On the basis of the signal GAC from the GAC generating circuit 15 and the 13-bit setting data from the register file 6, the frequency error value setting circuit 16 calculates the maximum allowable frequency value and the minimum allowable frequency value and outputs them to the comparators $11_1 \sim 11_8$.

When the signal GACEN from the register file 6 is at high level, the gate circuit 17 outputs a frequency error signal PLLERR1~8 from the comparators $11_1 \sim 11_8$ of the corresponding channel if one or more of the signals PHOK1~PHOK8 generated on the basis of the signal TMSNS is at high level. The signal TMSNS and the signals PHOK1 through PHOK8 are discussed in detail below.

The AND gate $18_1$ outputs a high level signal to the AND gate $18_5$ and the register $13_1$ when the frequency error signal from the comparator $11_1$ and the frequency error signal from the comparator $11_2$ are both at high level.

The AND gate $18_2$ outputs a high level signal to the AND gate $18_6$ and the register $13_3$ when the frequency error signal from the comparator $11_3$ and the frequency error signal from the comparator $11_4$ are both at high level.

The AND gate $18_3$ outputs a high level signal to the AND gate $18_7$ and the register $13_5$ when the frequency error signal from the comparator $11_5$ and the frequency error signal from the comparator $11_6$ are both at high level.

The AND gate $18_4$ outputs a high level signal to the AND gate $18_8$ and the register $13_7$ when the frequency error signal from the comparator $11_7$ and the frequency error signal from the comparator $11_8$ are both at high level.

The AND gate $18_5$ includes 16 AND elements and outputs the 16-bit sum from the adder $12_1$ to the register $13_2$ when a high level signal is input from the AND circuit $18_1$.

The AND gate $18_6$ includes 16 AND elements and outputs the 16-bit sum from the adder $12_2$ to the register $13_4$ when a high level signal is input from the AND circuit $18_2$.

The AND gate $18_7$ includes 16 AND elements and outputs the 16-bit summation from the adder $12_3$ to the register $13_6$ when a high level signal is input from the AND circuit $18_3$.

The AND gate $18_8$ includes 16 AND elements and outputs the 16-bit summation from the adder $12_4$ to the register $13_8$ when a high level signal is input from the AND circuit $18_4$.

The OR circuit 19 outputs a high level signal to the register 26 of the GAC generating circuit 15 when one or more of the signals PHOK1~PHOK8 is at high level.

The adder 21 generates signals CONT1 and CONT2 for output to the AND circuit $22_3$ and the GAC generating circuit 15 by summing the one-bit data stored in the registers $13_1$, $13_3$, $13_5$, and $13_7$ respectively.

The AND circuit $22_1$ outputs a high level signal to the AND circuit $22_4$ when the contents of the registers $13_1$ and the contents of the register $13_3$ are both at high level.

The AND circuit $22_2$ outputs a high level signal to the AND circuit $22_5$ when the contents of the registers $13_5$ and the contents of the register $13_7$ are both at high level.

The AND circuit $22_3$ outputs a high level signal to the AND circuits $22_4$ and $22_5$ and the inverter 24 when both signals CONT1 and CONT2 from the adder 21 are at high level.

The AND circuit $22_4$ outputs high level signal to the OR circuit $23_1$ when the signals from the AND circuits $22_1$ and $22_3$ are both at high level.

The AND circuit $22_5$ outputs a high level signal to the OR circuit $23_2$ when the signals from the AND circuits $22_2$ and $22_3$ are both at high level.

The AND circuit $22_6$ includes 17 AND elements and outputs the 17-bit sum from the adder $12_5$ to the GAC generating circuit 15 when the signal from the OR circuit $23_1$ is at high level.

The AND circuit $22_7$ includes 17 AND elements and outputs the 17-bit sum from the adder $12_6$ to the GAC generating circuit 15 when the signal from the OR circuit $23_2$ is high level.

The OR circuit $23_1$ outputs a high level signal to the AND circuit $22_6$ when at least one of the signals from the AND circuit $22_4$ and the inverter 24 is at high level.

The OR circuit $23_2$ outputs a high level signal to the AND circuit $22_7$ when at least one of the signals from the AND circuit $22_5$ and the inverter 24 is at high level.

The inverter 24 inverts the signal from the AND circuit $22_3$ for output to the OR circuits $23_1$ and $23_2$.

The register 26 operates when the signal from the OR circuit 19 is at high level while maintaining its contents without alteration when the signal from the OR circuit 19 is at low level. Further, the register 26 is reset when the signal CALIBRATE for calibrating the frequency to be phase-locked becomes high level.

Each circuit in FIG. 2 operates in synchronization with the standard clock signal 1XCLOCK. The signals PLLfreq1~PLLfreq8 input to the comparators $11_1$~$11_8$ of each channel are compared with the maximum allowable frequency value and minimum allowable frequency value from the frequency error value setting circuit 16.

Assuming that the value of the GAC signal is A and that the set value supplied to the frequency error value setting circuit 16 from the register file 6 is B, the maximum allowable frequency value is A+B, whereas the minimum allowable frequency value is A−B.

When the signals PLLfreq1~PLLfreq8 are within the allowable frequency range between the maximum allowable frequency value and the minimum allowable frequency value, a high level signal is output respectively from the comparators $11_1$~$11_8$ to the AND circuits $18_1$~$18_4$.

Specifically, a high level signal is output from the comparators $11_1$ and $11_2$ to the AND circuit $18_1$. A high level signal is output from the comparators $11_3$ and $11_4$ to the AND circuit $18_2$. A high level signal is output from the comparators $11_5$ and $11_6$ to the AND circuit $18_3$. A high level signal is output from the comparators $11_7$ and $11_8$ to the AND circuit $18_4$.

Consequently, in the case where both the signals PLLfreq1 and PLLfreq2 are within the allowable frequency range, a high level signal is output from the AND circuit $18_1$ to the AND circuit $18_5$ and the register $13_1$. In the case where both the signals PLLfreq3 and PLLfreq4 are within the allowable frequency range, a high level signal is output from the AND circuit $18_2$ to the AND circuit $18_6$ and the register $13_3$. In the case where both the signals PLLfreq5 and PLLfreq6 are within the allowable frequency range, a high level signal is output from the AND circuit $18_3$ to the AND circuit $18_7$ and the register $13_5$. In the case where both the signals PLLfreq7 and PLLfreq8 are within the allowable frequency range, a high level signal is output from the AND circuit $18_4$ to the AND circuit $18_8$ and the register $13_7$.

On the other hand, the signals PLLfreq1~PLLfreq8 input to the comparators $11_1$~$11_8$ of each channel are also output to the adders $12_1$~$12_4$.

Specifically, the signals PLLfreq1 and PLLfreq2 input to the comparators $11_1$ and $11_2$ are output to the adder $12_1$, summed by the adder $12_1$, and output to the AND circuit $18_5$. The signals PLLfreq3 and PLLfreq4 input to the comparators $11_3$ and $11_4$ are output to the adder $12_2$, summed by the adder $12_2$, and output to the AND circuit $18_6$. The signals PLLfreq5 and PLLfreq6 input to the comparators $11_5$ and $11_6$ are output to the adder $12_3$, summed by the adder $12_3$, and output to the AND circuit $18_7$. The signals PLLfreq7 and PLLfreq8 input to the comparators $11_7$ and $11_8$ are output to the adder $12_4$, summed by the adder $12_4$, and output to the AND circuit $18_8$.

Consequently, if both the signals PLLfreq1 and PLLfreq2 are within the allowable frequency range, the sum of those is stored in the register $13_2$. If both the signals PLLfreq3 and PLLfreq4 are within the allowable frequency range, the sum of those is stored in the register $13_4$. If both the signals PLLfreq5 and PLLfreq6 are within the allowable frequency range, the sum of those is stored in the register $13_6$. If both the signals PLLfreq7 and PLLfreq8 are within the allowable frequency range, the sum of those is stored in the register $13_8$.

The contents of the registers $13_1$, $13_3$, $13_5$, and $13_7$ are summed by the adder 21 in the input-channels-number determining circuit 14. That sum is supplied as the control signals CONT1 and CONT2 to the GAC generating circuit 15 and the AND circuit $22_3$.

There are a total of four groups of signals PLLfreq each group of which includes two signals, that is; the signals PLLfreq1 and PLLfreq2, the signals PLLfreq3 and PLLfreq4, the signals PLLfreq5 and PLLfreq6, and the signals PLLfreq7 and PLLfreq8. In the case where there are three groups wherein both signals PLLfreq are within the allowable frequency range, a high level signal is output from the AND circuit $22_3$.

Consequently, when there are zero, one, two, or four groups with both signals PLLfreq lying within the allowable frequency range, a high level signal is output from the inverter 24 to the OR circuits $23_1$ and $23_2$ from which a high level signal is output to the AND circuits $22_6$ and $22_7$. Therefore, the sums of the adders $12_5$ and $12_6$ are output from the AND circuits $22_6$ and $22_7$ to the GAC generating circuit 15.

On the other hand, different results are obtained in the case where there are three groups wherein both signals PLLfreq are within the allowable frequency range. Specifically, when all of the signals PLLfreq1 through PLLfreq4 are within the allowable range, a high level signal is output from the AND circuit $22_1$ to the AND circuit $22_4$ which in turn outputs a high level signal to the OR circuit $23_1$, whereas the sum from the adder $12_5$ is output through the AND circuit $22_6$ to the GAC generating circuit 15. Further, when all of the signals PLLfreq5 through PLLfreq8 are within the allowable range, a high level signal is output from the AND circuit $22_2$ to the AND circuit $22_5$ which in turn outputs a high level signal to the OR circuit $23_2$, whereas the sum from the adder $12_6$ is output through the AND circuit $22_7$ to the GAC generating circuit 15. In other words, in the case where there are three groups wherein both signals PLLfreq are within the allowable frequency range, only the value of the sum of two groups of four signals PLLfreq (i.e., the signals PLLfreq1~PLLfreq4 and the signals PLLfreq5~PLLfreq8) not including signals PLLfreq outside the allowable frequency range is supplied to the GAC generating circuit 15.

The GAC generating circuit 15 adds the sum from the AND circuits $22_6$ and $22_7$ and generates the signal GAC by dividing the sum according to the value of the signals CONT1 and CONT2 from the adder 21 for storing in the register 26.

In other words, as shown in Table 1 below, when there are four groups wherein both signals PLLfreq lie within the allowable frequency range, all signals PLLfreq1~PLLfreq8 are summed, and the resulting sum is divided by eight to provide the signal GAC. When there are three groups wherein both signals PLLfreq lie within the allowable frequency range, four signals PLLfreq are summed, and the resulting sum is divided by four to provide the signal GAC. When there are two groups wherein both signals PLLfreq lie within the allowable frequency range, four signals PLLfreq are summed, and the resulting sum is divided by four to provide the signal GAC. When there is one group wherein both signals PLLfreq lie within the allowable frequency range, two signals PLLfreq are summed, and the resulting sum is divided by two to provide the signal GAC. When there are no groups wherein both signals PLLfreq lie within the allowable frequency range, the resulting sum is zero, so that the quotient will be the same regardless of the divisor. In this case, however, since each of the signals CONT1 and CONT2 is the same as in the case where there are four groups with both signals laying within the allowable frequency range, the sum will be divided by eight to provide the signal GAC.

TABLE 1

| Number of Groups without Error | 4 | 3 | 2 | 1 | 0 |
|---|---|---|---|---|---|
| CONT1 | 0 | 1 | 1 | 0 | 0 |
| CONT2 | 0 | 1 | 0 | 1 | 0 |
| Divisor | 8 | 4 | 4 | 2 | 8 |

Such a process for dividing the signals PLLfreq1~PLLfreq8 into four groups of two is advantageous for simplifying the circuit arrangement.

As a result of this simplification of the circuit arrangement, the signal GAC becomes zero in the case where one of the signals PLLfreq in every group is outside the allowable frequency range, for example. The signal GAC of 0 means that the average frequency is equal to the frequency of the standard clock signals 1XCLOCK. The values of the setting data supplied from the register file 6 to the frequency error value setting circuit 16 are determined appropriately so that the remaining normal signals PLLfreq do not fall outside the allowable frequency range in this case as well.

The signal GAC obtained in this way is fed back to the frequency error value setting circuit 16 and the BSADPLL circuits $2_1$~$2_8$, while also being supplied to the tape speed variation detecting circuit contained in the GAC circuit 4.

In the case where the signals PLLfreq1~PLLfreq8 are outside the allowable frequency range, low level frequency error signals PLLERR1~PLLERR8 are output from the comparators $11_1$~$11_8$ via the gate circuit 17.

Figure 3:
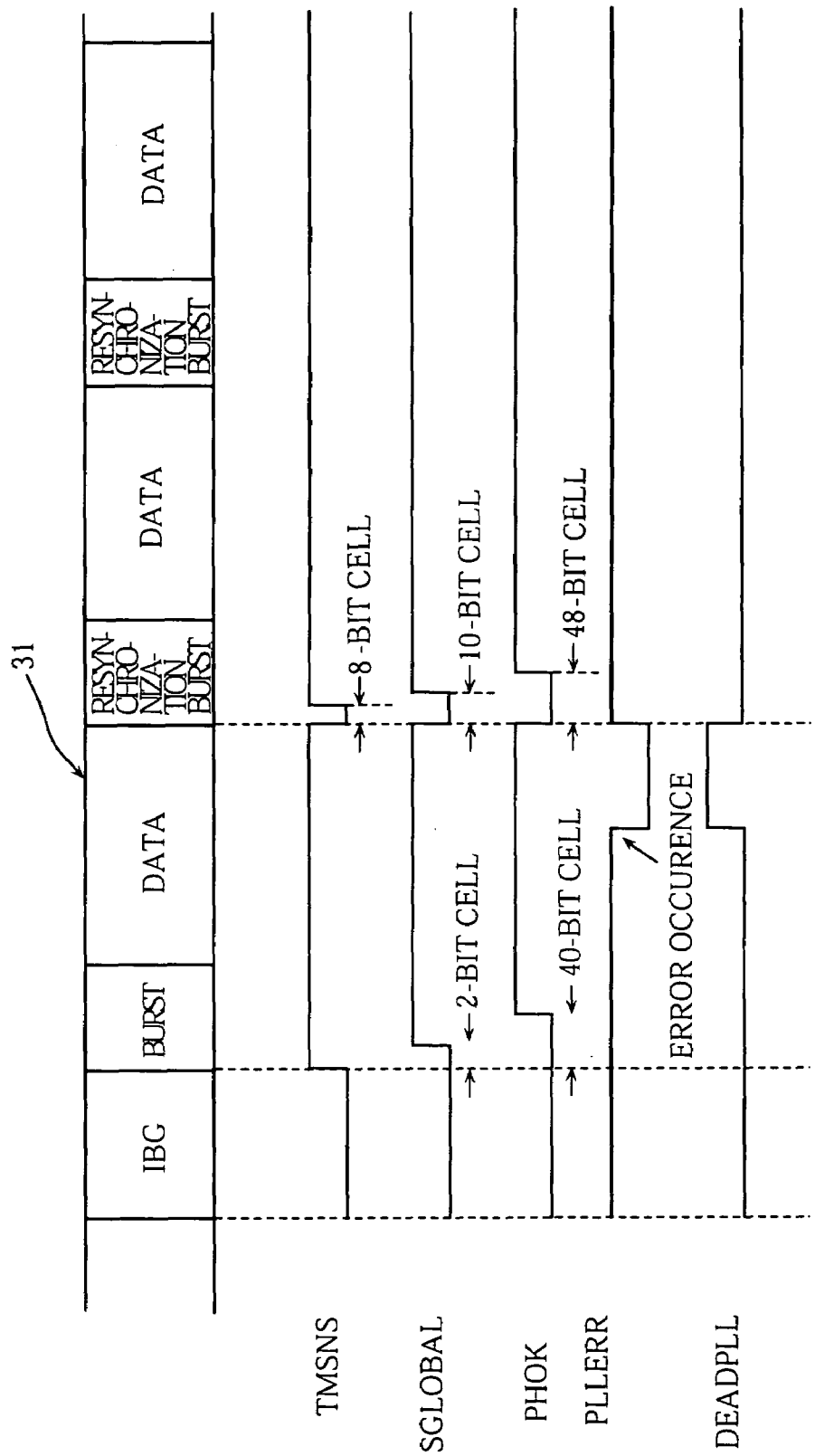
FIG. 3 is a timing chart for illustrating the resynchronization operation performed by the digital phase locked loop circuit shown in FIG. 1.

As shown in FIG. 3, when the reading position of each read head reaches the burst zone of the magnetic tape 31, the signal TMSNS of each channel supplied from outside the digital phase locked loop circuit becomes high. On the basis of this signal TMSNS, the signals SGLOBAL and PHOK for each channel are generated within that digital phase locked loop circuit. The signal SGLOBAL rises after a 2-bit cell from the rise of the signal TMSNS. The signal PHOK rises after a 40-bit cell from the rise of the signal TMSNS.

When the signal TMSNS rises, the signal GAC held in the register 26 of the GAC generating circuit 15 is taken out by the BSADPLL circuits $2_1$~$2_8$ which then oscillate at the frequency determined by the signal GAC. During the period of the 40-bit cell before the signal PHOK rises, the BSADPLL circuits $2_1$~$2_8$ perform synchronition of the signal PKPLS in the lead-in mode. When the signal PHOK rises, the BSADPLL circuits $2_1$~$2_8$ switch to the tracking mode and perform synchronous tracking.

When the frequency of the signal PKPLS of any channel becomes abnormal due for example to drop out after synchronization is complete, the frequency error signal PLLERR of that channel becomes low. The frequency error signal PLLERR is inverted and latched within the digital phase locked loop circuit and output therefrom as the frequency error signal DEADPLL. Accordingly, when the reading position of the read head reaches the resynchronization burst zone of the magnetic tape 31, the signal TMSNS supplied from outside the digital phase locked loop circuit is reset and becomes low, and rises after an 8-bit cell.

Consequently, the same operation is repeated for a relevant channel as performed when the read position of the read head matches the burst zone of the magnetic tape 31, so that the BSADPLL circuits synchronize the signal PKPLS in the lead-in mode. In the lead-in mode, the normal state is promptly recovered because the tracking gain is higher than in the tracking mode. The frequency error signal DEADPLL is reset when the signal TMSNS is reset.

In this way, a shift from the synchronization state can be detected immediately for each channel because the frequency error signals PLLERR1~8 are output from the comparators $11_1$~$11_8$ for each channel.

Further, it is possible to accurately determine the average frequency because erring channels are excluded from the calculation of the signal GAC.

Further, the digital phase locked loop circuit can respond flexibly to various changes of specifications because the allowable frequency range can be altered freely by changing the set values in the registers of the register file 6 supplied to the frequency error value setting circuit 16.

The frequency error signals PLLERR1~8 are not output except during the tracking mode, because the signals PHOK1~8 are supplied to the gate circuit 17 for gating the frequency error signals PLLERR1~8.

Because the signal based on the signals PHOK1~8 is supplied from the OR circuit 19 to the register 26 of the GAC generating circuit 15, synchronization can be performed promptly using the signal GAC held in the register 26 when the read position of the read head matches the burst zone of the magnetic tape 31.

Figure 4:
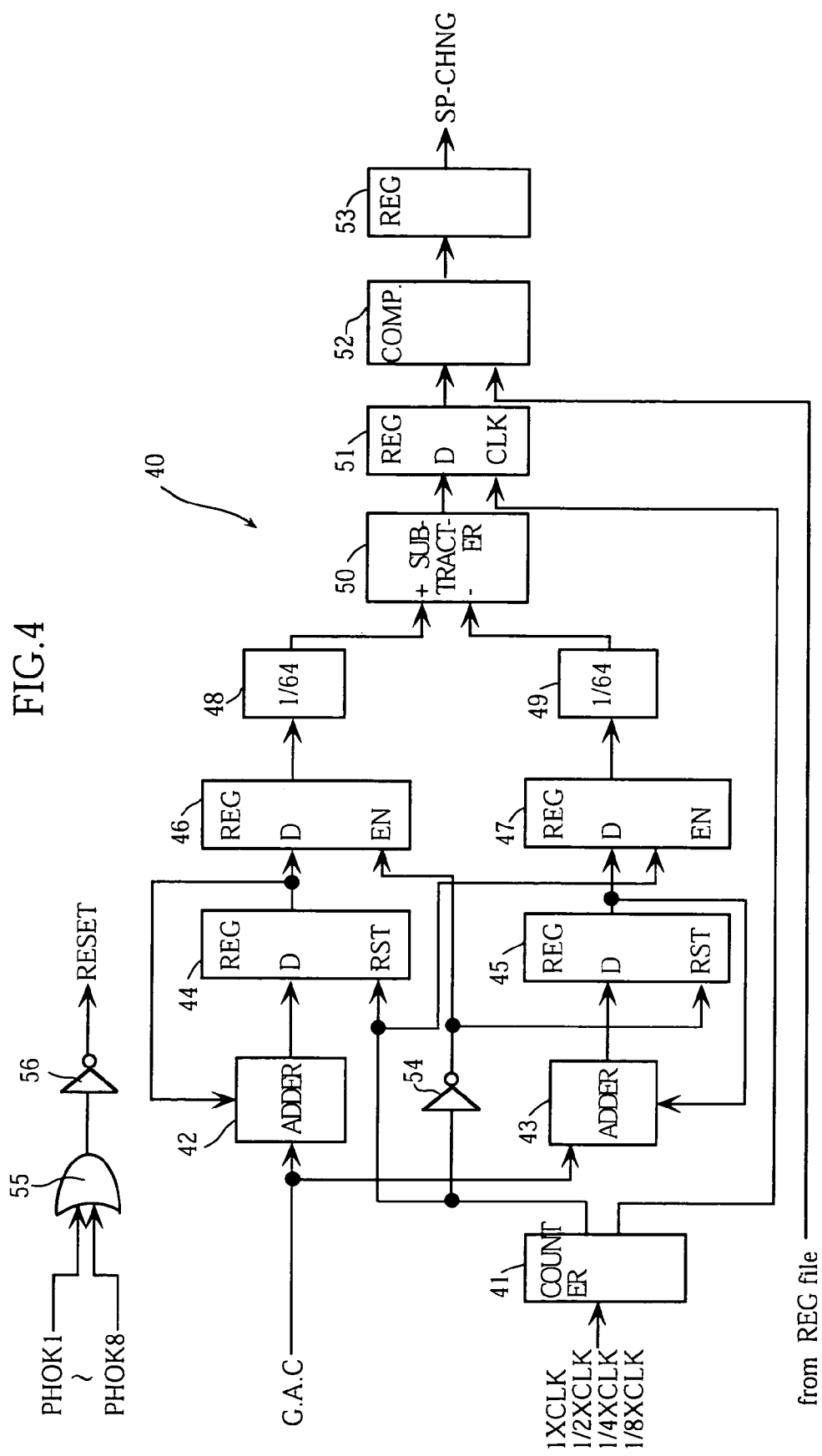
FIG. 4 is a circuit block diagram of the tape speed variation detecting circuit provided for the GAC circuit shown in FIG. 2.

As shown in FIG. 4, the tape speed variation detecting circuit 40 incorporated in the GAC circuit 4 includes a counter 41, adders 42 and 43, registers 44 through 47, dividers 48 and 49, a subtracter 50, a register 51, a comparator 52, a register 53, an inverter 54, an OR circuit 55, and an inverter 56.

The counter 41 divides the input clock signals by 128. Specifically, for each count of 64 input clock signals, the signal output to the registers 44 and 47 and the inverter 54 is inverted alternatly between high level and low level. Further, the counter 41 divides the input clock signals by 64. Specifically, the signal output to the register 51 is inverted alternately between high level and low level for each count of 32 input clock signals.

The adder 42 adds the signal GAC from the register 26 in the GAC generating circuit 15 to the output from the register 44, and supplies the sum to the register 44.

The adder 43 adds the signal GAC from the register 26 in the GAC generating circuit 15 to the output from the register 45, and supplies the sum to the register 45.

The register 44 operates in synchronization with clock signals input to the counter 41. The register 44 takes out the stored sum from the adder 42 for output to the register 46 and adder 42 when the signal supplied from the counter 41 to the reset terminal is low.

The register 45 operates in synchronization with clock signals input to the counter 41. The register 45 takes out the stored sum from the adder 43 for output to the register 47 and adder 43 when the signal supplied from the inverter 54 to the reset terminal is low.

The register 46 operates in synchronization with clock signals input to the counter 41. When the signal supplied from the inverter 54 to the enable terminal is high, the register 46 takes out the stored sum from the register 44 for output to the divider 48.

The register 47 operates in synchronization with clock signals input to the counter 41. When the signal supplied from the counter 41 to the enable terminal is high, the register 47 takes out the stored sum from the register 45 for output to the divider 49.

The divider 48 divides the stored sum from the register 46 by 64 for output of the quotient to the subtracter 50.

The divider 49 divides the stored sum from the register 47 by 64 for output of the quotient to the subtracter 50.

The subtracter 50 calculates the difference between the output from the divider 48 and the output from the divider 49 for feeding the resulting difference to the register 51.

The register 51 synchronizes in operation with the signals input from the counter 41 to the clock signal input terminal. It takes out the calculated difference from the subtracter 50 for output to the comparator 52.

The comparator 52 compares the difference from the register 51 with the set value from the register file 6 for output of a high level signal to the register 53 if the difference from the register 51 is within the allowable range according to the set value from the register file 6.

The register 53 synchronizes in operation with the standard clock signals 1XCLOCK. It takes out the signal from the comparator 52 for output of that signal as the speed error signal SPCHNG.

The inverter 54 inverts the signal from the counter 41 for output to the registers 45 and 46.

The OR circuit 55 outputs a low level signal to the inverter 56 when all of the signals PHOK1~PHOK8 are low.

The inverter 56 inverts the signal from the OR circuit 55 for output of that signal as the reset signal to each circuit in the tape speed variation detecting circuit 40.

When all of the signals PHOK1~PHOK8 are low, the output of the OR circuit 55 turns to low level while the output of the inverter 56 turns to high level for output of a reset signal which is used to reset each circuit of the tape speed variation detecting circuit 40. In other words, the tape speed variation detecting circuit 40 operates only when one or more channels is in the tracking mode, as is clear from FIG. 3.

One of the following signals is input to the counter 41: standard clock signals 1XCLOCK, clock signals 1/2XCLOCK obtained by dividing the standard clock signals 1XCLOCK by two, clock signals 1/4XCLOCK obtained by dividing the standard clock signals 1XCLOCK by four, clock signal 1/8XCLOCK obtained by dividing the standard clock signals 1XCLOCK by 8. The set value in a selected register of the register file 6 determines which clock signals are input.

Assuming now that the standard clock signals 1XCLOCK are input to the counter 41, the output of the counter 41 becomes low for a duration of 64 cycles of the standard clock signals 1XCLOCK. This causes the register 44 to be in an unreset state, the register 45 to be in a reset state, the register 46 to be in an enabled state, and the register 47 to be in a disabled state. As a result, the signals GAC are cumlatively input to the adder 42 for summing every cycle of the standard clock signals 1XCLOCK and for storing the resulting sum in the register 46. The sum stored in the register 46 is divided by 64 in the divider 48, and the resulting quotient is output to the subtracter 50.

Upon lapse of a period of 64 cycles of the standard clock signals 1XCLOCK, the output of the counter 41 is inverted for causing the register 44 to be in a reset state, the register 45 to be in an unreset state, the register 46 to be in a disabled state, and the register 47 to be in an enabled state. This state continues for 64 cycles of the standard clock signals 1XCLOCK. As a result, the average frequency signal GAC is cumulatively input to the adder 43 for summing ever cycle of the standard clock signals 1XCLOCK and and for storing the resulting sum in the register 47. The sum stored in the register 47 is divided by 64 in the divider 49 and the result is output to the subtracter 50. The output of the subtracter 50 is stored in the register 51 every 64 cycles of the standard clock signals 1XCLOCK.

Consequently, the register 51 stores the difference between the average of 64 GAC signals in a period of 64 cycles of the standard clock signals 1XCLOCK and the average of 64 GAC signals in the next period of 64 cycles of the standard clock signals 1XCLOCK. The comparator 52 compares this difference with the standard value from a prescribed register of the register file 6. If the difference exceeds the standard value, a high level signal is output from the comparator 52. This high level signal is stored in the register 53 and is output as a speed error signal SPCHNG.

The same operations are repeated at every 64 cycles of the standard clock signals 1XCLOCK.

Figure 5A:
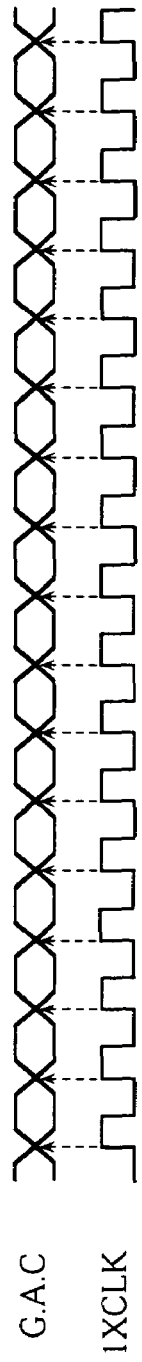
FIG. 5A through FIG. 5D are timing charts for illustrating the sampling operation of the tape speed variation detecting circuit shown in FIG. 4.

As discussed above, in the case where the standard clock signals 1XCLOCK are input to the counter 41, a GAC signal is taken out every cycle of the standard clock signals 1XCLOCK as shown in FIG. 5A, and the difference between the average of 64 GAC signals and the average of the subsequent 64 GAC signals is compared with a standard value. Thus, variations of the average frequency signal GAC are monitored every 64 cycles of the standard clock signals 1XCLOCK.

Figure 5B:
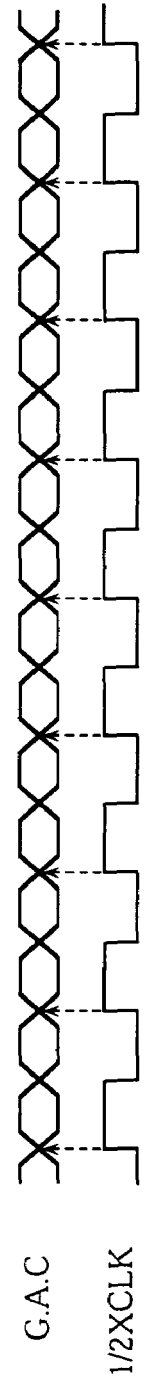

In the case where the clock signals 1/2XCLOCK obtained by dividing the standard clock signals 1XCLOCK by two are input to the counter 41, a GAC signal is taken out every two cycles of the standard clock signals 1XCLOCK as shown in FIG. 5B, and the difference between the average of 64 GAC signals and the average of the subsequent 64 GAC signals is compared with a standard value. Thus, variations of the average frequency signal GAC are monitored every 128 cycles of the standard clock signals 1XCLOCK.

Figure 5C:
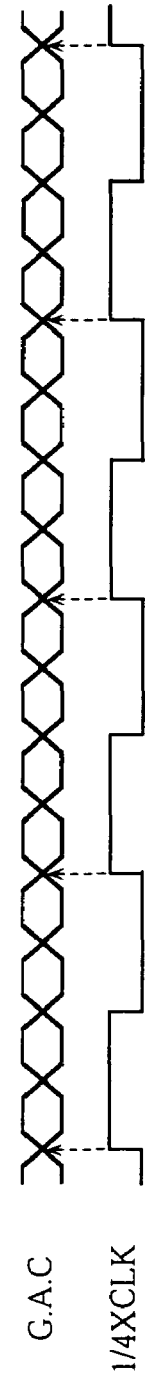

In the case where the clock signals 1/4XCLOCK obtained by dividing the standard clock signals 1XCLOCK by four are input to the counter 41, a GAC signal is taken out every four cycles of the standard clock signal 1XCLOCK as shown in FIG. 5C, and the difference between the average of 64 GAC signals and the average of the subsequent 64 GAC signals is compared with a standard value. Thus, variations of the average frequency signal GAC are monitored every 256 cycles of the standard clock signal 1XCLOCK.

Figure 5D:
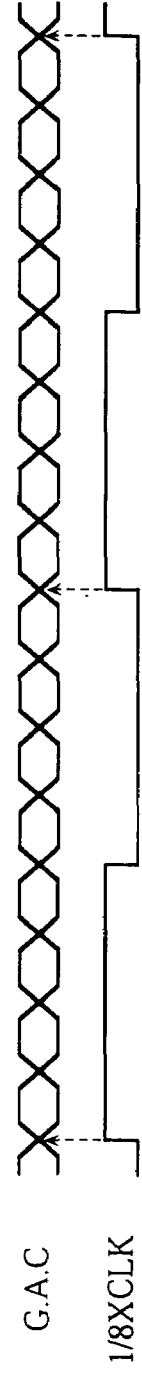

In the case where the clock signals 1/8XCLOCK obtained by dividing the standard clock signals 1XCLOCK by eight are input to the counter 41, a GAC signal is taken out every eight cycles of the standard clock signals 1XCLOCK as shown in FIG. 5D and the difference between the average of 64 GAC signals and the average of the subsequent 64 GAC signals is compared with a standard value. Thus, variations of the average frequency signal GAC are monitored every 512 cycles of the standard clock signal 1XCLOCK.

In this way, the time interval for monitoring variations of the average frequency signal GAC can be changed freely by switching the frequency of the clock signals XCLOCK supplied to the counter 41.

The speed error signal SPCHNG supplied from the register 53 of the tape speed variation detecting circuit 40 is output outside of the digital phase locked loop circuit. Variations of the average frequency signal GAC correspond to variations in the traveling speed of the magnetic tape 31. When the variations of the average frequency signal GAC is outside the allowable range, this indicates that the variations in the traveling speed of the magnetic tape 31 exceed the allowable range.

When the speed error signal SPCHNG turns to high level by a so-called read-back check, a so-called retry operation is performed wherein writing onto the magnetic tape 31 is temporarily suspended and the magnetic tape 31 is rewound for rewriting the same data. In the read-back check, the standard value supplied to the comparator 52 in the tape speed variation detecting circuit 40 is a very strict value compared to that supplied for normal reading. This is because, during normal reading, the traveling speed of the magnetic tape 31 may vary oppositely to writing, so that strict control over the allowable value of the variation in the traveling speed of the magnetic tape 31 during writing ensures reliable reading during normal reading.

What is claimed is:

1. A digital phase locked loop circuit for generating sampling clock signals used with respect to a plurality of channels for sampling reproduced information simultaneously from a plurality of tracks of a recording medium, comprising:
    an average frequency computing circuit for calculating an average frequency of the phase locked sampling clock signals in selected channels and feeding back the calculated average to the phase locked loop;
    wherein the average frequency computing circuit outputs a frequency error signal with respect to any channel in which the frequency of the sampling clock signals is outside an allowable frequency range;
    wherein the average frequency computing circuit comprises a comparator for comparing the frequency of the sampling clock signals in each channel with the allowable frequency range and for outputting the frequency error signal for any channel in which the frequency of the sampling clock signals is outside the allowable frequency range; and
    wherein the digital phase locked loop circuit further comprises a gate circuit for masking the frequency error signal in an operational mode other than a tracking mode.

2. The digital phase locked loop circuit according to claim 1, wherein the average frequency computing circuit calculates the average frequency of the sampling clock signals in the selected channels which do not include those channels in which the frequency of the sampling clock signals is outside the allowable frequency range.

3. The digital phase locked loop circuit according to claim 1, further comprising:
    a register for adjustably setting a value representative of an allowable deviation,
    wherein the allowable frequency range is determined on the basis of the average frequency calculated by the average frequency computing circuit and the set value from the register.

4. The digital phase locked loop circuit, according to claim 1, wherein the average frequency computing circuit divides the plurality of channels into a plurality of groups each of which includes at least two channels, the frequencies of the sampling clock signals for the plurality of channels being summed repetitively and cumulatively group by group for calculating the average frenquency.

5. The digital phase locked loop circuit according to claim 1, wherein the average frequency computing circuit is reset in a calibration mode for performing calibration of the frequencies to be phase locked.

6. The digital phase locked loop circuit according to claim 1, wherein the average frequency computing circuit includes a holding circuit for holding the average frequency which has been obtained immediately previously when all of the channels are in an operational mode other than a tracking mode.

7. The digital phase locked loop circuit according to claim 1, wherein when the average frequency computing circuit outputs the frequency error signal for any channel, resynchronization of the sampling clock signals is performed only for the erring channel.

8. The digital phase locked loop circuit according to claim 7, wherein the resynchronization of the sampling clock signals is performed at high speed in a lead-in mode by using the average frequency calculated by the average frequency computing circuit.

9. A digital phase locked loop circuit for generating sampling clock signals used with respect to a plurality of channels for sampling reproduced information simultaneously from a plurality of tracks of a recording medium, comprising:
    an average frequency computing circuit for calculating an average frequency of the phase locked sampling clock signals in selected channels and feeding back the calculated average to the phase locked loop;
    wherein the average frequency computing circuit comprises a speed variation detecting circuit for determining a rate of variation of the average frequency in a predetermined time.

10. The digital phase locked loop circuit according to claim 9, wherein the rate variation detecting circuit includes a comparator for comparing a variation width, in the predetermined time, of the average frequency determined by the average frequency computing circuit with an allowable variation range and for outputting a speed error signal if the variation width is outside the allowable variation range.

11. The digital phase locked loop circuit according to claim 9, wherein the speed variation detecting circuit is capable of adjustably setting the predetermined time.

12. A digital phase locked loop circuit for generating sampling clock signals used with respect to a plurality of channels for sampling reproduced information simultaneously from a plurality of tracks of a recording medium, comprising:
    an average frequency computing circuit for calculating an average frequency of the phase locked sampling clock signals in selected channels and feeding back the calculated average to the phase locked loop;
    wherein the average frequency computing circuit outputs a frequency error signal with respect to any channel in which the frequency of the sampling clock signals is outside an allowable frequency range;
    wherein the average frequency computing circuit comprises a comparator for comparing the frequency of the sampling clock signals in each channel with the allowable frequency range and for outputting the frequency error signal for any channel in which the frequency of the sampling clock signals is outside the allowable frequency range; and
    wherein the average frequency computing circuit is reset in a calibration mode for performing calibration of the frequencies to be phase locked.

13. A digital phase locked loop circuit for generating sampling clock signals used with respect to a plurality of channels for sampling reproduced information simultaneously from a plurality of tracks of a recording medium, comprising:
    an average frequency computing circuit for calculating an average frequency of the phase locked sampling clock signals in selected channels and feeding back the calculated average to the phase locked loop;
    wherein the average frequency computing circuit outputs a frequency error signal with respect to any channel in which the frequency of the sampling clock signals is outside an allowable frequency range;

wherein the average frequency computing circuit comprises a comparator for comparing the frequency of the sampling clock signals in each channel with the allowable frequency range and for outputting the frequency error signal for any channel in which the frequency of the sampling clock signals is outside the allowable frequency range; and wherein the average frequency computing circuit includes a holding circuit for holding the average frequency which has been obtained immediately previously when all of the channels are in an operational mode other than a tracking mode.

14. A digital phase locked loop circuit for generating sampling clock signals used with respect to a plurality of channels for sampling reproduced information simultaneously from a plurality of tracks of a recording medium, comprising:

an average frequency computing circuit for calculating an average frequency of the phase locked sampling clock signals in selected channels and feeding back the calculated average to the phase locked loop;

wherein the average frequency computing circuit outputs a frequency error signal with respect to any channel in which the frequency of the sampling clock signals is outside an allowable frequency range;

wherein the average frequency computing circuit comprises a comparator for comparing the frequency of the sampling clock signals in each channel with the allowable frequency range and for outputting the frequency error signal for any channel in which the frequency of the sampling clock signals is outside the allowable frequency range; and wherein when the average frequency computing circuit outputs the frequency error signal for any channel, resynchronization of the sampling clock signals is performed only for the erring channel.

* * * * *